United States Patent [19]

Hayashi

[11] Patent Number: 4,631,250
[45] Date of Patent: Dec. 23, 1986

[54] PROCESS FOR REMOVING COVERING FILM AND APPARATUS THEREFOR

[75] Inventor: Chikara Hayashi, Chigasaki, Japan

[73] Assignee: Research Development Corporation of Japan, Tokyo, Japan

[21] Appl. No.: 711,475

[22] Filed: Mar. 13, 1985

[51] Int. Cl.[4] .......... G03C 11/24; B24B 1/00; B24C 1/00; B08B 7/00
[52] U.S. Cl. .................. 430/329; 430/291; 51/319; 51/320; 134/7
[58] Field of Search .......... 430/329, 291; 134/7; 51/320, 319

[56] References Cited

U.S. PATENT DOCUMENTS

| 3,074,822 | 1/1963 | Walk et al. | 137/7 |
| 3,089,775 | 5/1963 | Lindall | 51/320 |
| 3,676,963 | 7/1972 | Rice et al. | 51/320 |
| 3,702,519 | 11/1972 | Rice et al. | 51/320 |
| 4,038,786 | 8/1977 | Fong | 51/320 |
| 4,389,820 | 6/1983 | Fong et al. | 51/320 |
| 4,468,453 | 8/1984 | Nakamura et al. | 430/291 |

Primary Examiner—Richard L. Schilling
Attorney, Agent, or Firm—Abelman Frayne Rezac & Schwab

[57] ABSTRACT

A process for removing covering films by blowing $CO_2$ particles against the film. Fine ice particles may be mixed with the $CO_2$ particles.

2 Claims, 2 Drawing Figures

PROCESS FOR REMOVING COVERING FILM AND APPARATUS THEREFOR

SUMMARY OF THE INVENTION

The present invention relates to a process for removing a covering film characterized in that $CO_2$ particles are blown against a covering film applied to a surface of a substrate.

The $CO_2$ particles which are used can be in such a condition that fine ice particles are mixed therewith.

The prsent invention also encompasses an apparatus for carrying out a process as noted above and has a jet nozzle connected through a connecting pipe to a bomb containing liquefied carbonic acid gas which is arranged to be directed toward a substrate having thereon a covering film to be removed.

The apparatus for carrying out the process of the present invention may also comprise an air-tightly sealed chamber for forming $CO_2$ particles which is provided, on its rear side wall, with a $CO_2$ gas-introducing pipe and an $N_2$ gas-introducing pipe, and on its front side wall with a jet nozzle extending into a treatment chamber containing a substrate with a covering film to be treated.

The apparatus may also incorporate an $N_2$ gas-introducing pipe for accelerating a flow speed of $CO_2$ particles which is connected to a side surface of the jet nozzle.

In a further embodiment, the apparatus can also have the treatment chamber connected to a vacuum evacuation system.

DETAILED EXPLANATION OF INVENTION

This invention relates to such a process for removing a covering film such as a photoresist film or the like that is applicable to a photoetching process or the like in a semiconductor industrial field or the like, and an apparatus for carrying out the same process.

As for a process for removing such a photoresist film covering a surface of a substrate that becomes unnecessary after applied with a photoetching treatment in a semi-conductor manufacturing industry, for instance, there has been hitherto known such a type one that (i) the covering film is oxidized by a heated mixture liquid of bichromate and sulfric acid, that (ii) the covering film is heated to a high temperature under an oxygen gas current atmosphere in order to be burned, that (iii) the covering film is peeled off after the same is swelled by being immersed in a high temperature peeling agent or that (iv) the covering film is oxidized by heating caused by a glow discharge of high frequency under a low pressure oxygen gas current atmosphere.

These type ones, however, are inconvenient in that, there are resulted contamination of the surface of the substrate, adhesion of impurities thereto, damage or deterioration thereof, with the oxidizing liquid and the peeling agent, by heating, oxidation, burning, charring of the photoresist film, and thus manufacturing loss of the products, defective products or the like cannot be avoided.

This invention has for its object to provide a process for removing a covering film which abolishes any of the foregoing conventional processes, and can remove a covering film such as a photoresist film or the like while preventing a substrate from adhering of any contaminants and from the foregoing damage and detarioration caused by the heating and others, and it is characterized in that $CO_2$ particles are blown against a covering film applied to a surface of a substrate.

Another object of this invention is to provide an apparatus for carrying out the foregoing removing process.

One embodying example of this invention process will now be explained, in respect of the case that the same is applied to a photoetching treatment in a semiconductor manufacturing industry as follows:

A substrate comprising, for instance, a silicon plate is applied on its surface with a $SiO_2$ coating film. After this $SiO_2$ coating film is applied on its surface with a photoresist liquid, the solvent thereof is removed by prebaking. The resultant dried photoresist film is exposed with light under the condition that a photo mask is put thereon, whereby a predetermined resist pattern image is formed thereon. Thereafter, the exposed region thereof is, then, developed by a spray process, a dipping process or the like, while the unexposed region thereof covered by the mask is removed by a solvent. Thereafter, the adhesion property of the photoresist region to the substrate and the corrosion resistance property of the photoresist itself are improved by a post-paking. Thereafter, the substrate is immersed in an etching liquid for dissolving an unnecessary region not covered with the photoresist, whereby there is produced the substrate having an uneven predetermined pattern surface, that is, the etched substrate.

At this stage, the photoresist film which has become unnecessary is to be removed. According to this invention, any of the foregoing conventional removing processes used for that final photoresist removing step is not employed and instead thereof, $CO_2$ gas is sent out in a jet toward the photoresist surface on the substrate from a jetting nozzle connected to a bomb containing liquefied carbonic acid, so that $CO_2$ particles in a solid state are formed due to free expansion of the jetted gas and those particles are blown against the photoresist on the substrate to remove the same. Because these particles are $CO_2$, it is so advantageous that there is no fear of contaminating the substrate surface with the same, and that those particles are gasified immediately after being blown against the substrate and no $CO_2$ particles remain on the substrate surface as an adhered matter, to result in production of a clean substrate.

FIG. 1 shows one example of an apparatus for carrying out this invention process.

Referring to this figure, numeral 1 denotes a liquefied carbonic acid bomb, numeral 2 denotes a connecting pipe 2 led outwards therefrom, numeral 3 denotes a jetting nozzle of 1 mm in inner diameter connected to a forward end of the connecting pipe 2, numeral 4 denotes a flow meter interposed in the connecting pipe 2, and numeral 5 denotes a flow rate adjusting valve.

The resultant $CO_2$ particle blast apparatus comprising the foregoing members 1-5 is used as follows. A substrate a after subjected to the etching treatment is placed in front of the nozzle 3, and the liquefied carbonic acid is blown out through the nozzle 3 toward a resist film b of 0.4 micron in thickness remaining on the surface of the substrate a, under the condition that the direction of the nozzle 3 is kept at a right angle thereto or at an inclined angle in relation thereto, so that there are formed $CO_2$ particles as a result of the liquefied $CO_2$ being solidified by rapid cooling by free expansion thereof made at the time of blowout thereof from the bomb, and the resultant $CO_2$ particles are blown against the film is the amount of 30 grams or so, for instance, whereby the whole of the resist film b can be removed therefrom. The $CO_2$ particles are gasified immediately after the striking thereof thereagainst and are not entirely left behind on the surface of the substrate a, and thus the complete removal of the resist film b is achieved without any contamination of the substrate a.

It has been confirmed that the removing effect at the angle of 45 degrees of the nozzle in relation to the substrate is 10 times that at the right angle of the nozzle when the equal amount of $CO_2$ particles is blown against the substrate.

FIG. 2 shows an apparatus for carrying out a modified example of this invention process in which the resist film is removed by an accelerated blowout speed of $CO_2$ particles.

Referring to this figure, numeral 6 denotes a hermetically sealed chamber for forming $CO_2$ particles which has a jacket type peripheral wall 7 through which liquefied nitrogen is flown therethrough, and a rear wall 6a of the sealed chamber 6 is provided with $CO_2$ gas introducing pipe 8 and a $N_2$ gas introducing pipe 9 for carrying $CO_2$ particles, and a front wall 6b thereof is provided with a jetting nozzle 3 extending into a treatment chamber 10 positioned in front thereof so that the $CO_2$ gas introduced into the sealed chamber 6 through the introducing pipe 8 may be cooled and solidified by the liquefied nitrogen, and as a result innumerable $CO_2$ particles in a solid state may be produced in the sealed chamber 6 and, at the same time, the resultant $CO_2$ particles may be supplied into the nozzle 3, while being agitated and carried by the $N_2$ gas introduced into the chamber 6 through the introducing pipe 9, and thus the $CO_2$ particles may be blown out in a jet from the jetting nozzle 3. For accelerating the jetting flow thereof, in this case, nitrogen gas introducing pipe 11 for acceleration is connected to a side surface portion of the nozzle 3 so that the $N_2$ gas for acceleration may be flown thereinto. Numeral 12 denotes an adjusting valve interposed in the introducing pipe 11, numeral 13 denotes an adjusting valve interposed in the $CO_2$ gas introducing pipe 8, and numeral 14 denotes an adjusting valve interposed in the carrying $N_2$ gas introducing pipe 9.

The treatment chamber 10 is connected to a vacuum evacuation system (not illustrated) so that a blown out gas or the like in the chamber 10 may be sucked for discharge from the chamber, and an operation rod 15 is so inserted air-tightly through one side wall of the chamber 10 as to be movable to advance and retreat, and a substrate a is held by a forward end portion thereof and is located in front of the nozzle 3 so that a treatment for removing a covering film b of the substrate a may be carried out.

A recessed chamber 10a on the left side, in this Figure, of the chamber 10 is used to serve as a stock chamber for stocking substrates a stacked in layers to be treated one after another, and a recessed chamber 10b on the right side is used to serve as a stock chamber for stocking the substrates a after treatment.

An embodying example of this invention process using this apparatus is as follows:

$CO_2$ gas is introduced into the $CO_2$ particle forming chamber 6 through the $CO_2$ gas introducing pipe 8 at a flow rate of 0.31 NTP/min. (30 g/min.), while $N_2$ gas is introduced thereinto through the carrying $N_2$ gas introducing pipe 9 at a flow rate of 1 l/min. As a result thereof, the $CO_2$ gas introduced in the chamber 6 is rapidly cooled and solidified by the liquefied nitrogen gas so that innumerable $CO_2$ particles are produced, and a mass of these particles are supplied to the nozzle 3 by the $N_2$ gas, while being agitated by the same. The flow of the $CO_2$ particles supplied in the nozzle 3 is accelerated by the acceralating $N_2$ gas flown into the nozzle 3 through the accelerating $N_2$ gas introducing pipe 11 at a flow rate of 20 l/min., and thereby is sent out in a jet vigorously from the forward end of the nozzle 3 and be blown against the substrate a set in front thereof, and thereby the covering film b on the front surface thereof is broken and removed therefrom. Broken pieces of the removed covering film are carried away from the chamber 10 by the suction of the vacuum system and thus a covering film removing operation can be always in a clean condition and at high efficiency.

If this invention process for removing a covering film by $CO_2$ particles is used, for instance, in the foregoing photo etching treatment, from the stage of removing of the unexposed region after the exposure and development stage of the regist film, any use of an etching liquid can be entirely avoided. This invention process is not limited to application to removing the photoregist film but also can be applied to removing any kind of various covering films such as a covering film of nitrogen oxide or any other oxide, any desired organic high molecular film or the like.

Such a modified embodying example of this invention process can be considered that ice fine particles of $H_2O$ are used together with the $CO_2$ particles in such a condition that a proper amount thereof is mixed therewith.

The grain size of the $CO_2$ particles may be properly selected, but it is preferable to use especially super fine particles of below 0.1 micron at a such a final removing stage that the covering film is so made thin that the surface of the substrate is about to be revealed after the same is almost removed by the blasting of $CO_2$ particles of larger grain size thereagainst.

Thus, according to this invention, a covering film on a substrate is removed by blowing, that is, blasting of $CO_2$ particles thereagainst, so that the uncovered surface of the substrate can be obtained entirely free from any contamination, and in addition, because the particles are gasified after being blasted, there is no fear that blasted particles remain on the surface of the substrate as in the conventional sand blasting operation, and thus the operation can become smooth and it is especially useful for treatment of a fine or intricate surface.

Figure 1:
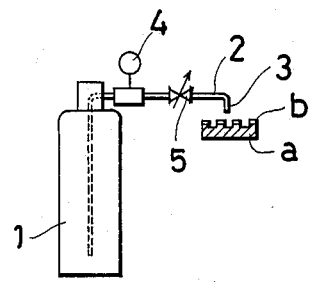
FIG. 1 is a side view, partly in section, of an apparatus for carrying out one example of this invention process.
Figure 2:
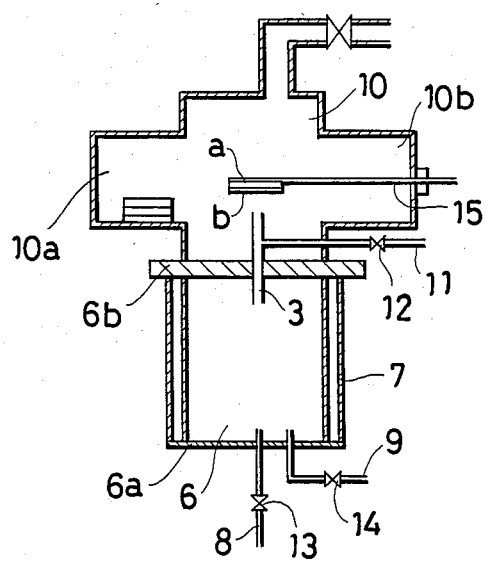
FIG. 2 is a sectional view of another example of the apparatus.

I claim:

1. A process for removing a covering film from a surface of a substrate wherein $CO_2$ particles, produced in an air-tight sealed chamber, are blown from a jet nozzle by $N_2$ gas, said $CO_2$ particles being introduced into a treatment chamber against a covering film applied to the surface of the substrate.

2. A process as claimed in claim 1, wherein the $CO_2$ particles are used in such a condition that fine ice particles are mixed therewith.

* * * * *